(12) United States Patent
Inuzuka et al.

(10) Patent No.: US 6,226,204 B1
(45) Date of Patent: May 1, 2001

(54) SEMICONDUCTOR INTEGRATED CIRCUIT DEVICE

(75) Inventors: Kazuko Inuzuka, Tokyo; Katsushi Nagaba, Kawasaki; Shigeo Ohshima, Yokohama, all of (JP)

(73) Assignee: Kabushuki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/141,450

(22) Filed: Aug. 27, 1998

(30) Foreign Application Priority Data

Aug. 30, 1997 (JP) .................................................. 9-249778

(51) Int. Cl.[7] .............................. G11C 16/04; G11C 8/00
(52) U.S. Cl. ...................................... 365/189.05; 365/233
(58) Field of Search ............................ 365/233, 189.05, 365/189.08, 189.11, 194

(56) References Cited

U.S. PATENT DOCUMENTS

| | | | |
|---|---|---|---|
| 5,592,434 | * 1/1997 | Iwamoto et al. ............. | 365/233 |
| 5,703,829 | * 12/1997 | Suzuki et al. ............... | 365/233 |
| 5,751,655 | * 5/1998 | Yamazaki et al. ........... | 365/233 |
| 5,841,730 | * 11/1998 | Kai et al. .................... | 365/233 |

* cited by examiner

*Primary Examiner*—Trong Phan
(74) *Attorney, Agent, or Firm*—Hogan & Hartson LLP

(57) ABSTRACT

The data output circuit in a clock synchronous DRAM comprises a first data transfer circuit to which the data read from a memory is input and which transfers the input data to the output side in synchronization with an internal clock, an equalizing circuit to which the output of the first data transfer circuit is input during a read operation by a burst operation and to which high-impedance data is input after the read operation, a second data transfer circuit connected to the equalizing circuit, and an output buffer to which the output of the second data transfer circuit is input. The second data transfer circuit transfers all the data to the output buffer in synchronization with an output clock. This eliminates the dependence of the data access time and data hold time on data item and/or cycle and facilitates the timing control of the output control signal.

8 Claims, 9 Drawing Sheets

SEMICONDUCTOR INTEGRATED CIRCUIT DEVICE

BACKGROUND OF THE INVENTION

The present invention relates to a semiconductor integrated circuit device, and more particularly to a semiconductor memory device, such as a DRAM (dynamic random access memory) or a clock synchronous DRAM, capable of facilitating the timing control of output signals.

This application is based on Japanese Patent Application No. 9-249778, filed Aug. 30, 1997, the content of which is incorporated herein by reference.

FIG. 1 is a system block diagram of a semiconductor memory device (clock synchronous DRAM) as an example of a conventional semiconductor integrated circuit device formed on a semiconductor substrate. The semiconductor memory device is mainly made of a memory cell array 3, in which a large number of memory cells are arranged in a matrix. A memory cell is the smallest unit of storage. The memory cell array 3 comprises word lines for selecting memory cells in the direction of row, bit lines for selecting memory cells in the direction of column, a row decoder for receiving a row address input signal and selecting a word line, a column decoder for receiving a column address input signal and selecting a bit line, and a sense amplifier for amplifying data stored in the accessed memory cell and transferred to a bit line.

In a DRAM or a clock synchronous DRAM, the signals flow as follows. The address signal is input from the input terminal to the memory cell array 3 in synchronization with the row and column select signals in a time-division manner and latched in each of the row and column address buffers. The row decoder selects and drives a word line, thereby accessing a memory cell. The data in the accessed memory cell is transferred to a bit line (data line). The data is amplified by the sense amplifier as well as written into the memory cell again. Next, the column decoder selects the output of the sense amplifier. The selected data is transferred to a data output circuit 4 via the bit line. To prevent the data in the memory cells from being destroyed, the series of operations is controlled by an internal synchronous signal and carried out in a predetermined sequence or timing.

The semiconductor memory device further comprises an input receiver circuit 1 that receives an externally supplied input signal and a control circuit 2, in addition to the above-described basic configuration (the memory cell array).

The data output circuit 4 will be explained in detail.

FIG. 2 is a functional block diagram of the data output circuit 4. The data output circuit 4 comprises a data transfer circuit 11 that receives the data read from the memory and appearing in a read signal RD, an equalizing circuit 12 to which the output of the data transfer circuit 11 is input, and an output buffer 13 to which the output of the equalizing circuit 12 is input and outputs an output signal DQ. The data transfer circuit 11 transfers the read signal RD in synchronization with an output clock OUTCLK. The equalizing circuit 12 operates in synchronization with an equalize signal EQ. During operations other than the read operation caused by a burst operation, the equalizing circuit 12 turns off the inverters in the data transfer paths and equalizes the data paths. The output buffer 13 brings the output terminal into one of the high level, low level, and high-impedance level according to the data transferred from the equalizing circuit 12 in synchronization with the equalize signal EQ.

FIG. 3 is a detailed circuit diagram of the data output circuit 4.

The output buffer 13 comprises a PMOS transistor 5 whose source is connected to a power-supply voltage Vcc and an NMOS transistor 6 whose source is connected to the ground Vss and whose drain is connected to the drain of the PMOS transistor 5. The drain of the PMOS transistor 5 and that of the NMOS transistor 6 are connected to an output terminal DQ.

An inverter 22 has its output connected to the gate of the PMOS transistor 5 and its input connected to the output of a clocked inverter 41. The input of the clocked inverter 41 is connected to the output of an inverter 24, to which the read signal RD is input. The drain of a PMOS transistor 9 is connected to a node #3 between the inverter 22 and PMOS transistor 5. The PMOS transistor 9 has its source connected to the power supply Vcc and its gate connected to the output of an inverter 21, to which the equalize signal EQ is input. In the clocked inverter 41, a pair of a PMOS transistor driven by the output clock OUTCLK and an NMOS transistor driven by the inverted signal BOUTCLK is added to an inverter as shown in FIG. 4.

In FIG. 3, an inverter 23 has its output connected to the gate of the NMOS transistor 6 and its input connected to the output of the clocked inverter 41. The drain of an NMOS transistor 10 is connected to a node #4 between the inverter 23 and NMOS transistor 6. The source of the NMOS transistor 10 is connected to the ground Vss. The equalize signal EQ is input to the gate of the NMOS transistor 10.

In FIG. 3, the inverter 24 and clocked inverter 41 constitute the data transfer circuit 11 and the inverters 21, 22 and 23, and transistors 9 and 10 constitute the equalizing circuit 12.

The operation of the data output circuit 4 shown in FIG. 3 will be explained by reference to FIG. 5. FIG. 5 shows the operating waveform of the data output circuit 4 shown in FIG. 3 when the latency=3, the burst length=4, and the data pattern="0101." Latency represents a period of time from a reception of a read command to output of data.

During operations other than the read operation caused by an equalize operation, the equalize signal EQ is high. In this situation, since the inverters 22 and 23 are off and the transistors 9 and 10 are on, the node #3 between the gate of the PMOS transistor 5 and the inverter 22 is high (H) and the node #4 between the gate of the NMOS transistor 6 and the inverter 23 is low (L), making the PMOS transistor 5 and NMOS transistor 6 turn off, which causes the high-impedance (HiZ) level to appear at the output terminal DQ.

When a read command signal is sensed in a first cycle C1 of an external clock CLK, the first bit in the read data is read on the node #1 between the inverter 24 and clocked inverter 41 in a second cycle C2. At this time, the output clock OUTCLK is low, the inverted signal BOUTCLK of the output clock OUTCLK is high, and the clocked inverter 41 is off.

When the output clock OUTCLK becomes high in a third cycle C3, the clocked inverter 41 turns on, causing the data on the node #1 to be transferred to the node #2 between the clocked inverter 41 and the inverters 22 and 23. After the data on the node #1 is transferred to the node #2, the clocks OUTCLK and BOUTCLK become low and high, and the clocked inverter 41 turns off, the next bit in the read data is read on node #1. When the data output circuit 4 is received a read command, the equalize signal EQ remains low during the time when the data output circuit 4 outputs the data in response to the output clocks OUTCLK and BOUTCLK. In the meantime, the inverters 22 and 23 turn on and the transistors 9 and 10 turn off, allowing the data on node #2 to be transferred to nodes #3 and #4, which causes the first data item D1 (="0") in the data pattern to appear at the output terminal DQ.

After a similar operation is repeated with the equalize signal EQ being kept low and the data items for the burst length (that is, four data items) are output, the equalize signal EQ returns to the high level in a seventh cycle C7 of the external clock, making the inverters 22 and 23 turn off and the transistors 9 and 10 turn on, which causes the high impedance level to appear at the output terminal DQ.

Such a conventional data output circuit 4 has the following problems.

The first problem is that the data access time $t_{AC}$ and the data hold time $t_{OH}$ differ according to data item or cycle. In the case of the data access time $t_{AC}$, data item D1 is output when the equalize signal EQ becomes low, so that the data access time $t_{AC}$ is determined by the equalize signal EQ. Data item D2 and subsequent ones, however, are output when the output clock OUTCLK becomes high, so that the data access time $t_{AC}$ is determined by the output clock OUTCLK. As described above, in the conventional data output circuit, the data access time $t_{AC}$ differs according to the data item. The same holds true for the data hold time $t_{OH}$.

When the equalize signal EQ becomes high after the output of data item D4, the output terminal DQ outputs the high impedance, allowing the data hold time $t_{OH}$ of data item D4 to be determined by the equalize signal EQ. Since data items up to data item D4 are output when the output clock OUTCLK becomes high, the data hold time $t_{OH}$ for data items before data item D3 is determined by the output OUTCLK, resulting in variations in the data hold time $t_{OH}$ from cycle to cycle.

The second problem is that the conventional output circuit is difficult to stabilize the variation of the data access time and the data hold time because the timing of each control signal has to coincide with that of the rest. FIG. 6 shows an operating waveform in a case where the timings of the equalize signal EQ and the output clock OUTCLK are shifted from the normal ones. As compared with the proper operation of FIG. 5, the equalize signal EQ becomes low earlier, making the output clock OUTCLK become high, which causes the inverters 22 and 23 to turn on before data item D1 is transferred to the node #2, permitting an invalid data item to be output. To prevent this problem, the equalize signal EQ should be made to become low after the output clock OUTCLK becomes high. Too large a margin, however, would lengthen the data access time $t_{AC}$ for data item D1, making it difficult to control of the timing of each signal.

BRIEF SUMMARY OF THE INVENTION

Accordingly, it is an object of the present invention to provide a semiconductor integrated circuit device with an output circuit which eliminates the dependence of the data access time and data hold time on data item or cycle and facilitates the timing control of the output control signals.

According to the present invention, there is provided a semiconductor integrated circuit device comprising a data output circuit for outputting the data read from a memory cell to the outside and a control circuit for supplying control signals to control the data transfer of the data output circuit, wherein all of the data items are output from the data output circuit in synchronization with an output clock, one of the control signals.

According to the present invention, receiving the output clock, the data output circuit outputs each of the high level, low level, and high-impedance level data items, which enables the data transfer path to be equalized during the output of the high-impedance level. Namely, all of the data items are output in synchronization with the output clock. This eliminates the dependence of the data access time and data hold time on data item and/or cycle and facilitates the timing control of the output control signal.

Additional objects and advantages of the present invention will be set forth in the description which follows, and in part will be obvious from the description, or may be learned by practice of the present invention.

The objects and advantages of the present invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE INVENTION

Figure 1:
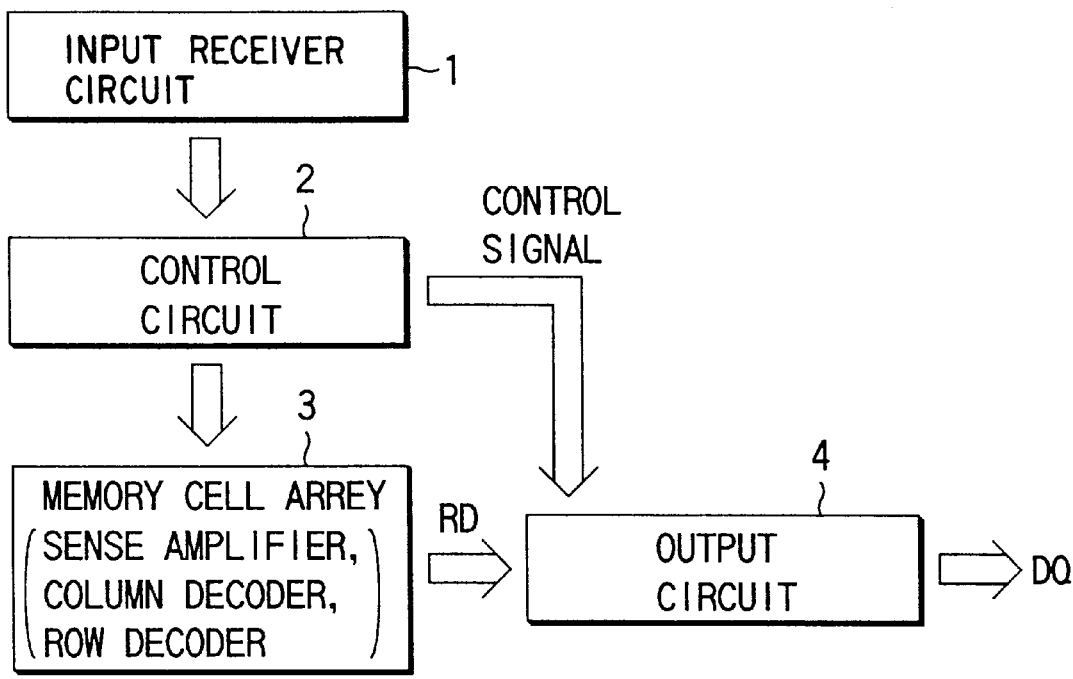
FIG. 1 is a block diagram of the basic configuration of a conventional synchronous DRAM.
Figure 2:
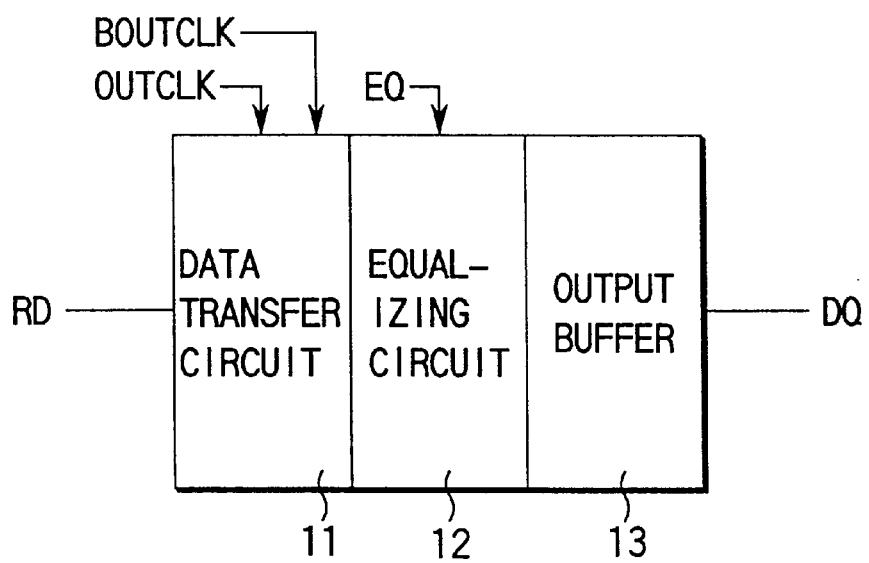
FIG. 2 is a functional block diagram of the data output circuit of FIG. 1.
Figure 3:
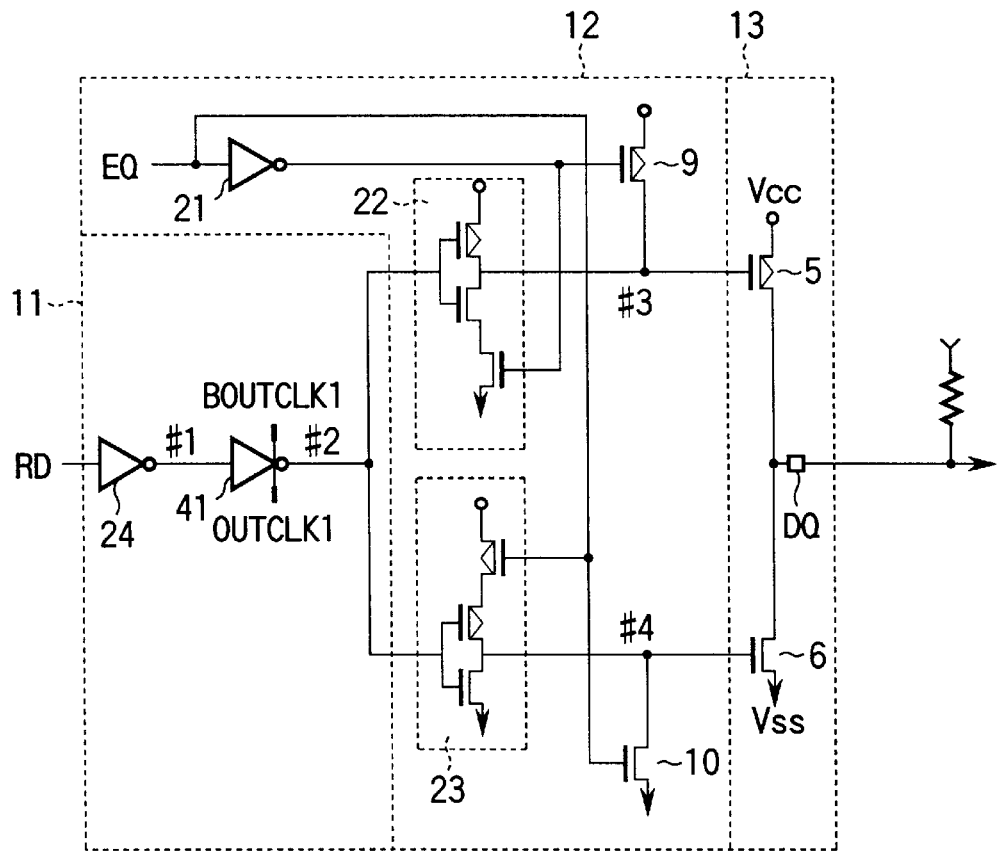
FIG. 3 is a detailed circuit diagram of the data output circuit of FIG. 1.
Figure 4:
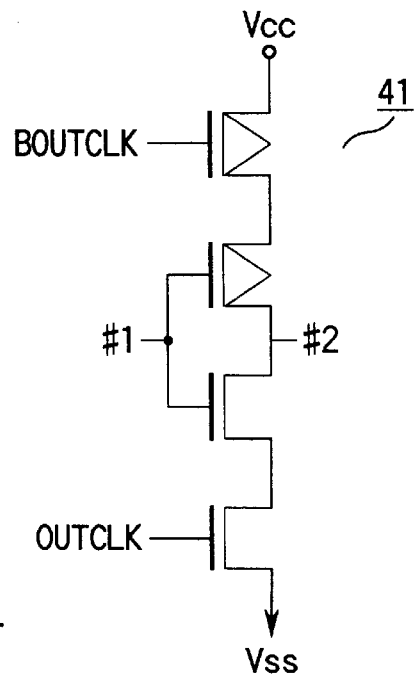
FIG. 4 is a circuit diagram of the clocked inverter in the data output circuit of FIG. 3.
Figure 5:
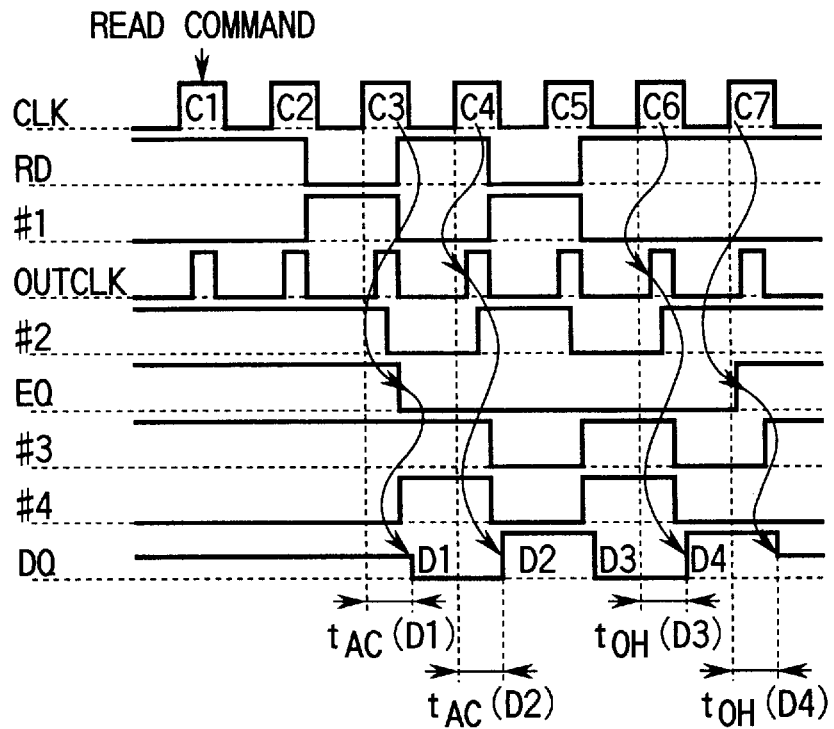
FIG. 5 is a waveform diagram explaining the operation of the data output circuit of FIG. 3.
Figure 6:
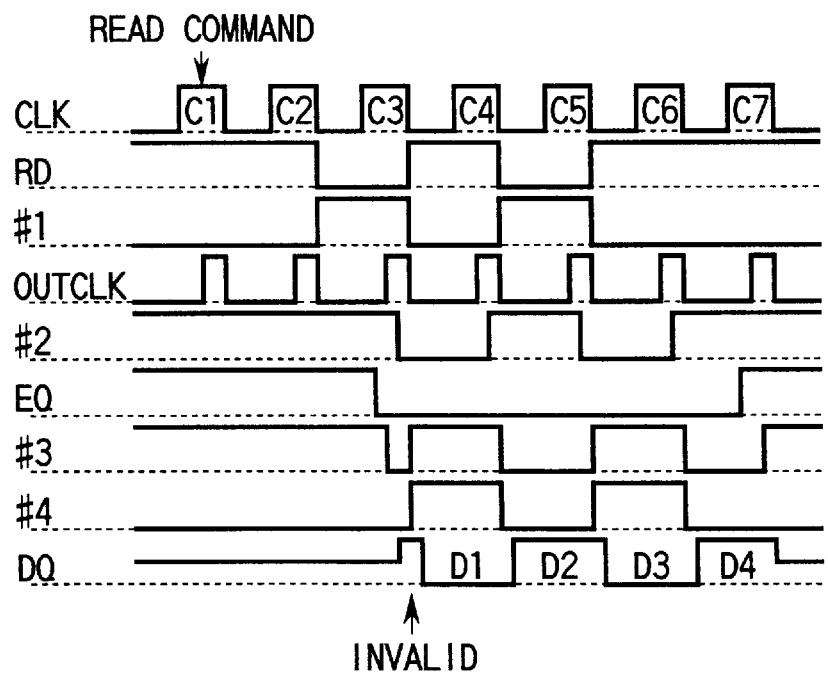
FIG. 6 is a waveform diagram explaining the operation of the data output circuit of FIG. 3 when the timing of the control signals shifts from the proper one.

A preferred embodiment of a semiconductor integrated circuit device according to the present invention will now be described with reference to the accompanying drawings. In explanation of the embodiments below, a synchronous DRAM shown in FIG. 1 is used as an example of a semiconductor integrated circuit device. Each of the waveforms explaining the operation of the data output circuit in each embodiment is assumed to have been obtained under the following conditions: the latency=3, the burst length=4, and the data pattern="0101." The output terminal DQ is assumed to be inside the chip and terminated to a constant potential outside the chip as shown in the conventional data output circuit of FIG. 3.

First Embodiment

Figure 7:
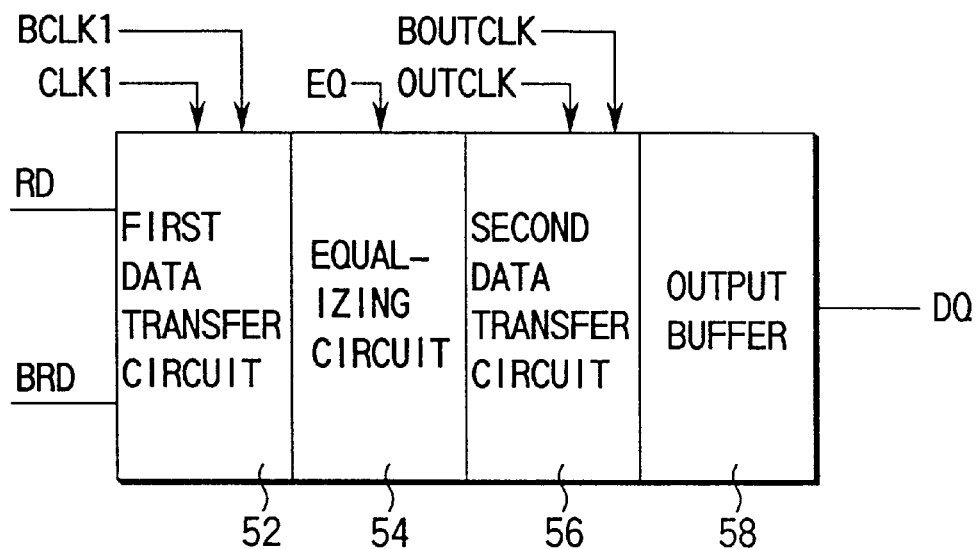
FIG. 7 is a functional block diagram of a data output circuit according to a first embodiment of a semiconductor integrated circuit device of the present invention.
Figure 8:
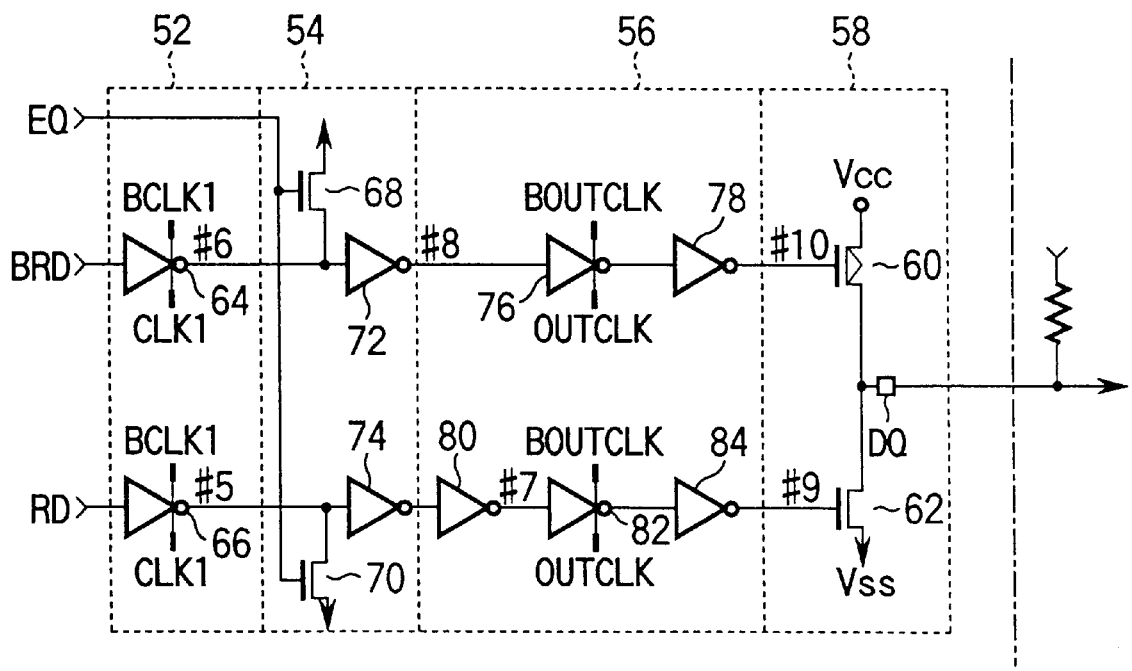
FIG. 8 is a detailed circuit diagram of the data output circuit of FIG. 7.
Figure 11:
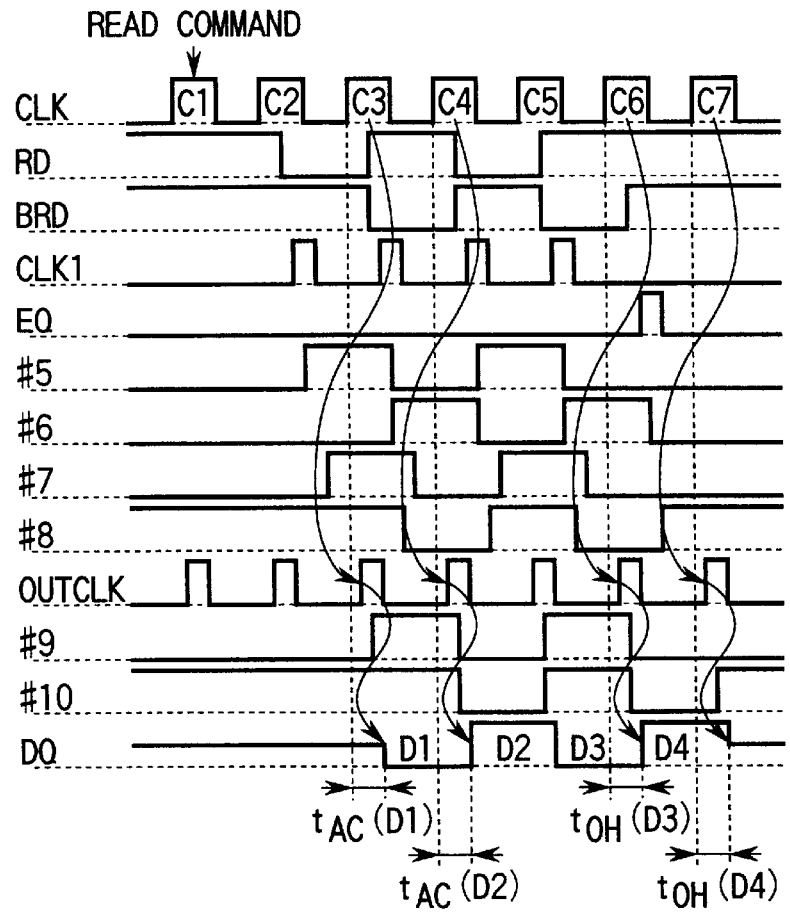
FIG. 11 is a waveform diagram explaining the operation of the data output circuit of the first embodiment.

FIG. 7 is a block diagram to help functionally explain a data output circuit in a synchronous DRAM according to a first embodiment of the present invention. FIG. 8 is a detailed circuit diagram of the data output circuit of FIG. 7. FIG. 11 is a waveform diagram explaining the operation of the data output circuit of FIG. 8.

As shown in FIG. 7, the data output circuit comprises a first data transfer circuit 52 that receives a read signal RD and its inverted signal BRD, an equalizing circuit 54 to which the output of the first data transfer circuit 52 is input, a second data transfer circuit 52 to which the output of the equalizing circuit 54 is input, and an output buffer 58 to which the output of the second data transfer circuit 56 is input and which outputs an output signal DQ.

The first data transfer circuit 52 transfers each bit (data item) in the data read from a memory to a read line pair in synchronization with an internal clock CLK1 and its inverted clock BCLK1. When all the bits are output, the equalizing circuit 54 outputs a high-impedance data item to a data path in the next cycle. The second data transfer circuit 56 transfers, in synchronization with an output clock OUTCLK and its inverted clock BOUTCLK, the HiZ data output in synchronization with the equalize signal EQ from the equalizing circuit 54. The second data transfer circuit 56 also transfers the read data output from the equalizing circuit 54. The output buffer 58 brings the output terminal DQ into any one of the high level, low level, and high-impedance level according to the data transferred in synchronization with the output clock OUTCLK from the second data transfer circuit 56.

FIG. 8 is a detailed circuit diagram of the data output circuit.

The output buffer 58 comprises a PMOS transistor 60 whose source is connected to a power-supply voltage Vcc and an NMOS transistor 62 whose source is connected to the ground Vss and whose drain is connected to the drain of the PMOS transistor 60.

The first data transfer circuit 52 is data transfer means that is driven in synchronization with the internal clock CLK1. It comprises, for example, clocked inverters 64 and 66. The inverted read signal BRD is input to the clocked inverter 64 and the read signal RD is input to the clocked inverter 66. The outputs of the clocked inverters 64 and 66 are connected to the equalizing circuit 54. An inverter 72 is connected to the output of the clocked inverter 64 and the drain of an NMOS transistor 68. An inverter 74 is connected to the output of the clocked inverter 66 and the drain of an NMOS transistor 70.

The equalizing circuit 54 operates in response to the equalize signal EQ and brings the nodes #5 and #6 into a fixed potential in equalization. It comprises, for example, the NMOS transistors 68 and 70 and the inverters 72 and 74. The equalize signal EQ is connected to the gates of the NMOS transistors 68 and 70. The NMOS transistor 68 has its source connected to the ground Vss and its drain connected to the output of the clocked inverter 64 (node #4). The NMOS transistor 70 has its source connected to the ground Vss and its drain connected to the output of the clocked inverter 66 (node #5).

The second data transfer circuit 56 operates in synchronization with the output clock OUTCLK. It comprises a component part that inverts and outputs the transferred signal from the equalizing circuit 54 and a component part that outputs the transferred signal as it is without inverting. For example, it comprises a series connection clocked inverters 76 and 78 and a series connection of an inverter 80, a clocked inverter 82, and an inverter 84. The clocked inverter may be connected in front of or behind the inverter. The number of clocked inverters is changeable as long as an odd number of clocked inverters are used in the upper stage, a path related to the inverted read signal BRD, and an even number of clocked inverters are used in the lower stage, a path related to the read signal RD.

The output of the inverter 78 is connected to the gate of the PMOS transistor 60 and the output of the inverter 84 is connected to the gate of the NMOS transistor 62.

The output buffer 58 serves to eliminate noise and comprises the PMOS transistor 60 and NMOS transistor 62 connected in series between a power-supply voltage Vcc differing from the power-supply voltage connected to the inverters and the ground terminal Vss. The output buffer 58 receives the data transferred from the second data transfer circuit 56. The transferred data is transferred from the common node to the output terminal DQ. Furthermore, a terminal potential (e.g., 1.4V) is supplied via a terminal resistor to a line connecting the output terminal DQ and an external device (e.g., a data processing unit, such as a CPU) to bring the line into the high-impedance level.

Figure 9:
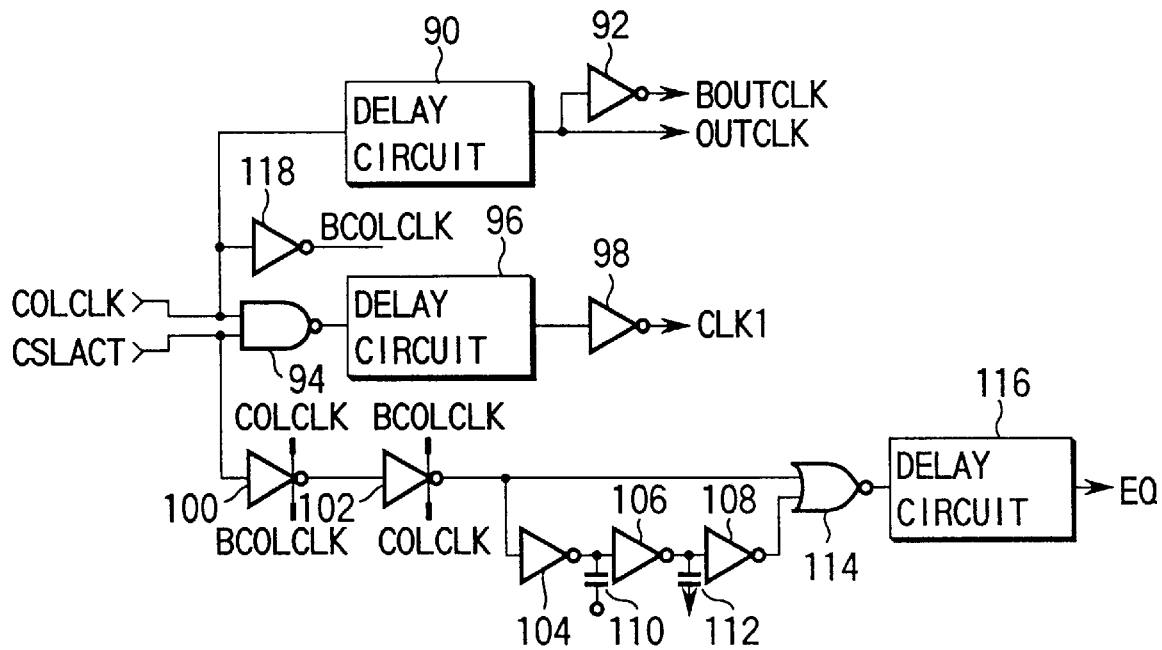
FIG. 9 is a circuit diagram of the control circuit for generating the control signals necessary for the data output circuit in the first embodiment.
Figure 10:
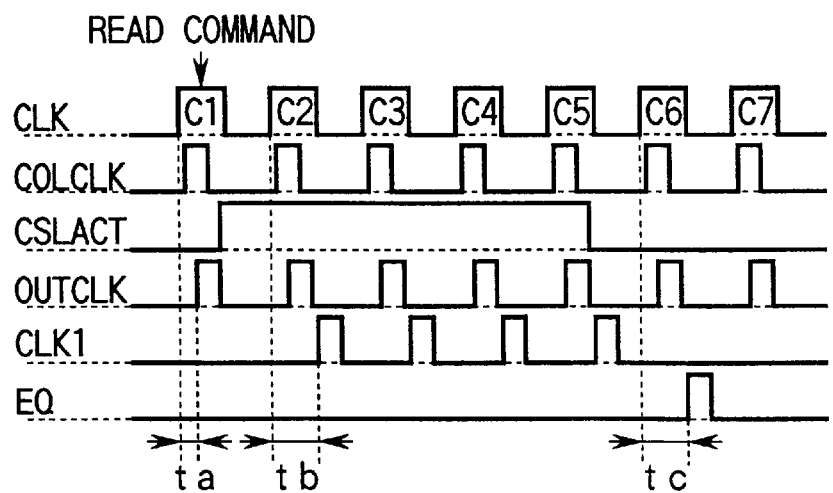
FIG. 10 is a signal waveform diagram in connection with the control circuit of FIG. 9.

Each of the output control signals for controlling the data output circuit will be described by reference to FIGS. 9 and 10. FIG. 9 is a circuit diagram of the control circuit that generates the output control signals, including the output clock OUTCLK (and its inverted clock BOUTCL), internal clock CLK1 (and its inverted clock BCLK1), and equalize signal EQ. FIG. 10 is an input/output waveform diagram in connection with FIG. 9.

COLCLK is an internal clock produced from an external clock CLK. CSLACT is a signal indicating the activation of a column in a read operation. Since the burst length=4, the signal CSLACT becomes high in response to the external clock CLK in a first cycle C1 and returns to the low level in response to the external clock CLK in a fifth cycle C5 four cycles later. The data output circuit of the present invention is controlled using the two clocks OUTCLK and CLK1, and single signal EQ.

The output clock OUTCLK is a signal obtained by delaying the internal clock COLCLK and the same as the conventional output clock OUTCLK. With the present invention, the data output in the preceding cycle is transferred in response to the internal clock CLK1 and the transistor in the output buffer at the last stage in the output circuit is driven in response to the output clock OUTCLK. The internal clock CLK1 is produced from the internal clocks COLCLK, CSLACT and generates as many pulses as correspond to the burst length (four pulses). When the output clock OUTCLK becomes high, a data item is output. After the output clock OUTCLK returns to the low level, the next data item is transferred in response to the internal clock CLK1. Therefore, the amount of delay (τb) from the external clock CLK to the internal clock CLK1 is designed to be larger than the amount of delay (τa) from the external clock CLK to the output clock OUTCLK.

The equalize signal EQ is produced from the internal clock CSLACT. It is a single pulse generated in the cycle of the external clock immediately after the last pulse of the internal clock CLK1 is generated. It is delayed so that its delay time (τb) from the external clock CLK may be equal to the internal clock CLK1 (τc). As a result, the high-impedance data item is also output with the same timing as that of the data item being read in a burst operation. Even if the internal clock CLK1 and equalize signal EQ have different pulse widths, there is no problem as long as their rising timing is the same.

As shown in FIG. 9, on the basis of the internal clocks COLCLK and CSLACT, a delay circuit 90 and an inverter 92 generate the output clock OUTCLK (and its inverted clock BOUTCLK). A NAND gate 94, a delay circuit 96, and an inverter 98 generate the internal clock CLK1. Clocked inverters 100 and 102, inverters 104, 106, and 108, capacitors 110 and 112, an NOR circuit 114, and a delay circuit 116 generate the equalize signal EQ. An inverter 118 generates the internal clock BCOLCLK.

Next, the operation of the data output circuit shown in FIG. 8 will be described by reference to the timing chart of FIG. 11.

The equalize signal EQ is an equalize start signal, which becomes high at a specific time at the start of equalization and otherwise is at the low level. When as many data items as correspond to the burst length (that is, four data items) are output, an EQ pulse is generated in response to the external clock CLK in the next cycle C6.

The internal clock CLK1 is a signal for transferring the data read from the memory into the read signal RD and its inverted signal BRD to the node #5 between the clocked inverter 66 and the NMOS transistor 70 and to the node #6 between the clocked inverter 64 and the NMOS transistor 68. When receiving the read command signal, the data output circuit generates as many internal clocks CLK1 as there are pulses in the burst length in synchronization with the external clock CLK. With the latency=3 and the burst length=4, the data output circuit receives the external clocks in the second cycle C2 to the fifth cycle C5 and generates four pulses of internal clock CLK1.

The output clock OUTCLK is a signal for outputting the data on a node #7 between the inverter 80 and the clocked inverter 82 and the data on a node #8 between the inverter 72 and the clocked inverter 76 to the output terminal DQ.

The operation of the data output circuit will be explained.

During the time excluding the equalize start time, the equalize signal EQ is low and the transistors 70 and 68 are off. When receiving a read command at the external clock CLK in the first cycle C1, the first bit in the read data is read into the read signal RD and its inverted signal BRD in response to the external clock CLK in the second cycle C2. At this time, the internal clock CLK1 is low and its inverted signal BCLK1 is high, turning off the inverters 64 and 66.

When the internal clock CLK1 becomes high in synchronization with the external clock CLK in the second cycle C2, the clocked inverters 64 and 66 turn on, allowing the data items in the read signal RD and its inverted signal BRD to appear at the nodes #5 and #6, respectively. The data item at the node #5 is transferred to the node #7 and the data item at the node #6 is transferred to the node #8. At this time, the output clock OUTCLK is low and its inverted signal BOUTCLK is high, turning off the clocked inverters 76 and 82. The second bit is read into the read signal RD and its inverted signal BRD.

When the output clock OUTCLK becomes high in synchronization with the external clock in the third cycle C3, the clocked inverters 82 and 76 urn on, allowing the data items at the nodes #7 and #8 to be output to the output terminal DQ.

After all the bits for the burst length are output, a pulse appears in the equalize signal EQ in response to the external clock CLK in the next cycle C6. In the meantime, the transistors 68 and 70 are on and the nodes #5, #6, and #7 are low and the node #8 is high.

Next, when the output clock OUTCLK becomes high in synchronization with the external clock CLK in the seventh cycle C7, the data items at the nodes #7 and #8 are transferred, the node #9 becomes the low level, the node #10 becomes the high level, and the high-impedance level is output to the output terminal DQ.

According to the first embodiment, the semiconductor integrated circuit device includes the data output circuit for outputting the data read from a memory cell to an external circuit and the control circuit for supplying a signal to control the data transfer of the data output circuit. In the data output circuit, any one of the low-level data item, high-level data item, and high-impedance-level data item is output in synchronization with the output clock. This makes it possible to equalize the data transfer path in outputting the high-impedance level. As a result, the data access time $t_{AC}$ and data hold time $t_{OH}$ are prevented from varying according to data item and/or cycle as shown in FIG. 11. This eliminates the dependence of the data access time and data hold time on data item and/or cycle and facilitates the timing control of the output control signal.

Other embodiments of the present invention will be explained. In the embodiments that follow, the same parts as those in the first embodiment are indicated by the same reference symbols and a detailed explanation of them will be omitted.

Second Embodiment

Figure 12:
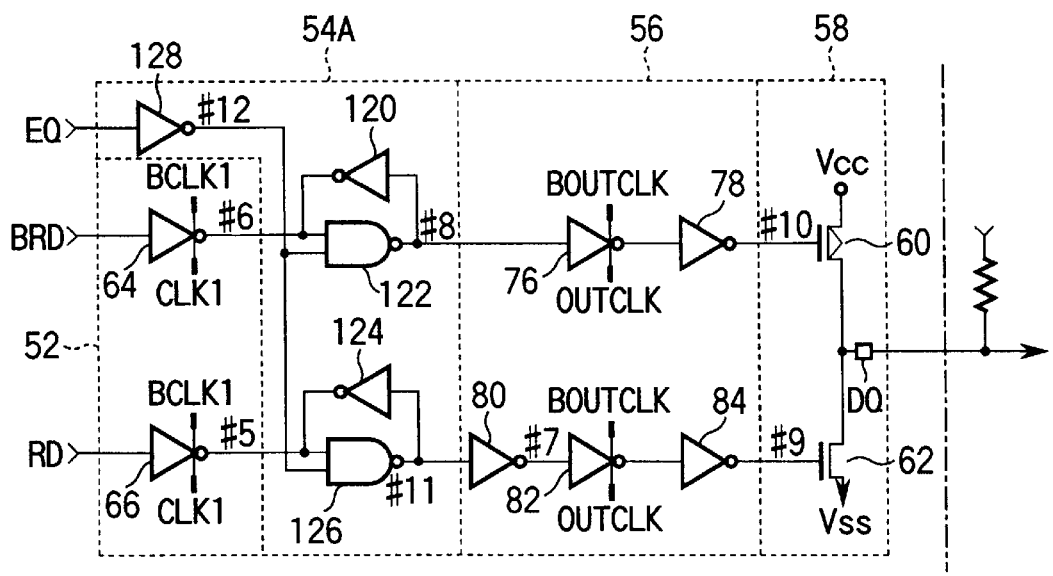
FIG. 12 is a detailed block diagram of a data output circuit according to a second embodiment of a semiconductor integrated circuit device of the present invention.
Figure 13:
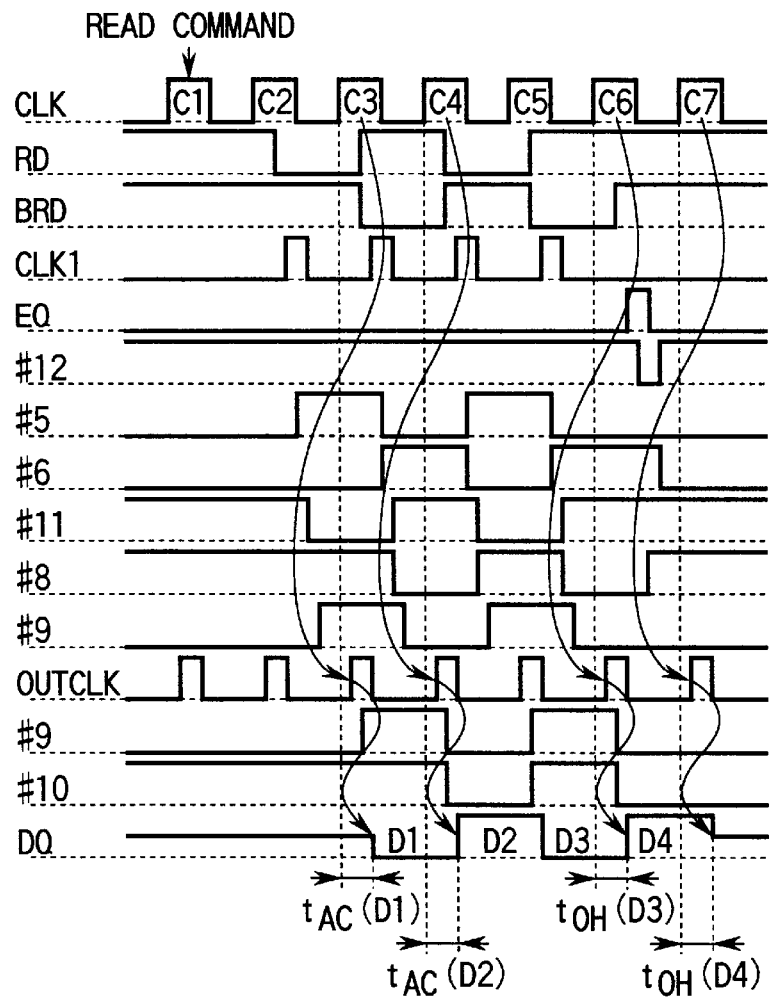
FIG. 13 is a waveform diagram explaining the operation of the data output circuit of the second embodiment.

FIG. 12 is a circuit diagram of the data output circuit in a synchronous DRAM according to a second embodiment of the present invention. FIG. 13 is a waveform diagram explaining the operation of the data output circuit of FIG. 12. A functional block diagram of the data output circuit is the same as that in the first embodiment of FIG. 7.

The data output circuit differs from that in the first embodiment of FIG. 8 in the circuit configuration of an equalizing circuit 54A. The circuit configuration of each of the first data transfer circuit 52, second data transfer circuit 56, and output buffer 58 is the same as that in the first embodiment. Specifically, in the equalizing circuit 54A, a parallel connection of an inverter 120 and an NAND gate 122 in an opposite direction is used in place of the NMOS transistor 68 and inverter 72 of FIG. 8 and a parallel connection of an inverter 124 and an NAND gate 126 in an opposite direction is used in place of the NMOS transistor 70 and inverter 74. In addition, the addition of an inverter 128 differs from that in FIG. 8.

The equalize signal EQ is an equalize start signal, which is low during the time excluding the equalize start time. When the data items for the burst length are output, pulses are generated in response to the external clock CLK in the next cycle.

The internal clock CLK1 is a signal for transferring the data item read from the memory into the read signal RD and its inverted signal BRD to the node #5 between the clocked inverter 66 and the NAND gate 126 and the node #6 between the clocked inverter 64 and the NAND gate 122. When receiving the read command signal, a number of pulses corresponding to the burst length are generated in synchronization with the external clock CLK. With the latency=3 and the burst length=4, when receiving the external clocks CLK from the second cycle C2 to the fifth cycle C5, four internal clock pulses CLK1 are generated.

The output clock OUTCLK is a signal for outputting the data item on the node #7 between the inverter 80 and the clocked inverter 82 and the data item on the node #8 between the NAND gate 122 and the clocked inverter 76 to the output terminal DQ.

The equalize signal EQ is low during the time excluding the equalize start time. As a result, the node #12 between the inverter 128 and the NAND gates 126 and 122 is high, which allows the NAND gates 126 and 122 to which the data on the node #12 is input to operate in the same manner as the inverters to which the data items on the node #5 and node #6 are input. When the read command signal is input in the first cycle C1 of the external clock CLK, the first bit in the data read from the memory is read into the read signal RD and its inverted signal BRD in response to the external clock CLK in the second cycle C2. At this time, the internal clock CLK1 is low and its inverted signal BCLK1 is high, turning off the clocked inverters 66 and 64.

When the internal clock CLK1 becomes high, the clocked inverters 64 and 66 turn on, allowing the data items in the read signal RD to be transferred from the node #5 to the node #7 (through node #11) and its inverted signal BRD to be transferred from the node #6 to the node #8. At this time, the output clock OUTCLK is low and its inverted signal BOUT-CLK is high and the clocked inverters 76 and 82 are off. In this state, the second bit in the read data is read into the read signal RD and its inverted signal BRD.

When the external CLK in the third cycle C3 is received and the output clock OUTCLK becomes high, the clocked inverters 76 and 82 turn on, allowing the data items on the node #7 and node #8 to be transferred to the output terminal DQ.

After all the bits for the burst length are output, a pulse is generated in the equalize signal EQ in response to the external clock CLK in the next cycle C6.

When the equalize signal EQ becomes high, the voltage at node #12 becomes low, bringing the node #11 and node #8 into the high level and the node #7 into the low level, regardless of the levels of the node #5 and node #6. At this time, because the internal clock CLK1 is low and the clocked inverters 66 and 64 are off, the data on the node #11 is inverted by the inverter 124 and the data on the node #8 is inverted by the inverter 120, which places the node #5 and node #6 at the low level.

Thereafter, even when the equalize signal EQ returns to the low level and the node #12 is placed at the high level, the node #11 and node #8 are kept at the high level because the node #5 and node #6 are at the low level.

Next, when the output clock OUTCLK becomes high in response to the external clock CLK in the seventh cycle C7, the data items on the node #7 and node #8 are transferred, placing the node #9 at the low level and the node #10 at the high level, which produces the high-impedance at the output terminal DQ.

As with the first embodiment, according to the second embodiment, in the data output circuit of the semiconductor integrated circuit device, any one of the low-level data item, high-level data item, and high-impedance-level data item is output in synchronization with the output clock. This makes it possible to equalize the data transfer path in outputting the high-impedance level. As a result, the data access time $t_{AC}$ and data hold time $t_{OH}$ are prevented from varying with data item and/or cycle as shown in FIG. 13. This eliminates the dependence of the data access time and data hold time on data item and/or cycle and facilitates the timing control of the output control signal.

Third Embodiment

A third embodiment of the present invention will be explained by reference to FIGS. 14 and 15.

Figure 14:
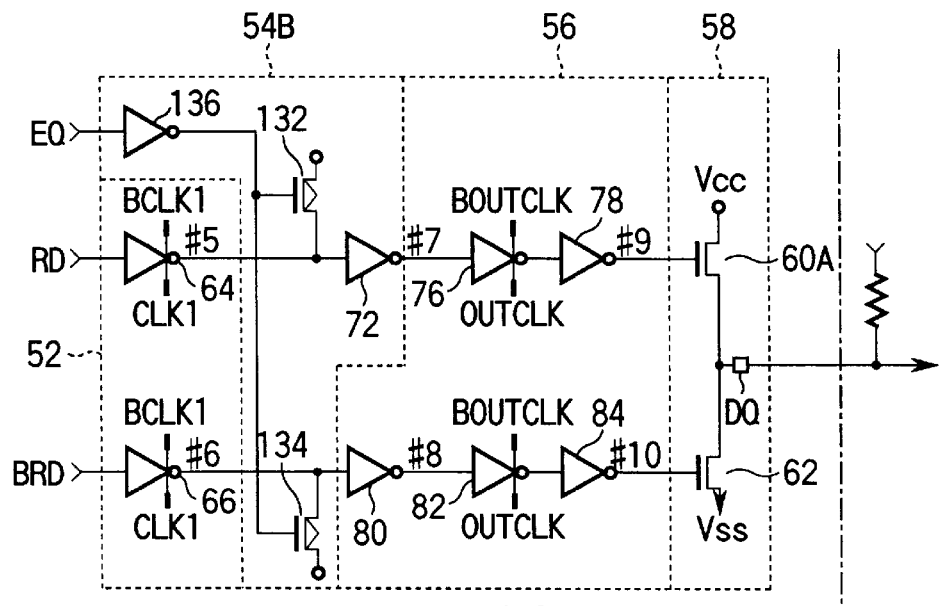
FIG. 14 is a detailed block diagram of a data output circuit according to a third embodiment of a semiconductor integrated circuit device of the present invention.
Figure 15:
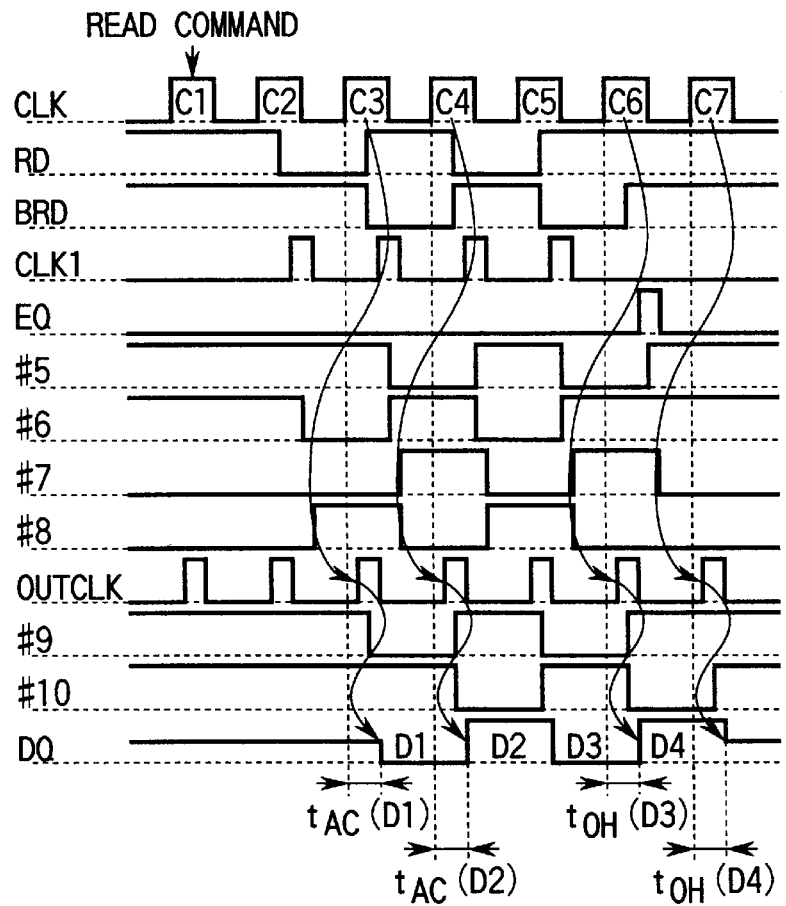
FIG. 15 a waveform diagram explaining the operation of the data output circuit of the third embodiment.

FIG. 14 is a circuit diagram of the data output circuit in a synchronous DRAM according to a third embodiment of the present invention. FIG. 15 is a waveform diagram explaining the operation of the data output circuit of FIG. 14. A functional block diagram of the data output circuit is the same as that in the first embodiment of FIG. 7.

The data output circuit differs from that in the first embodiment of FIG. 8 in the circuit configuration of an equalizing circuit 54B. The circuit configuration of each of the first data transfer circuit 52, second data transfer circuit 56, and output buffer 58 is the same as that in the first embodiment except that the signal RD is input to the clocked inverter 64 and the signal BRD is input to the clocked inverter 66. Because reference symbols are given to the nodes on the basis of the levels on the signal paths for the signals RD and BRD as in the first embodiment, they are assigned the opposite reference symbols to those in the first embodiment. The equalizing circuit 54B differs from that in the first embodiment in that a PMOS transistor 132 is used in place of the NMOS transistor 68 of FIG. 8, a PMOS transistor 134 is used in place of the NMOS transistor 70, the inverter 74 is eliminated, and an inverter 136 is added to the equalize signal EQ path. Furthermore, an NMOS transistor 60A is used in place of the PMOS transistor 60 in the output buffer 58.

The equalize signal EQ is an equalize start signal, which is low during the time excluding the equalize start time. When the data items for the burst length are output, a pulse is generated in response to the external clock CLK in the next cycle C6.

The internal clock CLK1 is a signal for transferring the data item read from the memory into the read signal RD and its inverted signal BRD to the node #5 between the clocked inverter 64 and the PMOS transistor 132 and the node #6 between the clocked inverter 66 and the PMOS transistor 134. When receiving the read command signal, a number of pulses corresponding to the burst length are generated in synchronization with the external clock CLK. With the latency=3 and the burst length=4, when receiving the external clocks CLK in the second cycle C2 to the fifth cycle C5, four internal clock pulses CLK1 are generated.

The output clock OUTCLK is a signal for outputting the data item on the node #7 between the inverter 72 and the clocked inverter 76 and the data item on the node #8 between the inverter 80 and the clocked inverter 82 to the output terminal DQ.

The equalize signal EQ is low during the time excluding the equalize start time, turning off the transistors 132 and 134. When the read command signal is input to the equalizing circuit 54B in response to the external clock CLK in the first cycle C1, the first bit in the data read from the memory is read into the read signal RD and its inverted signal BRD in response to the external clock CLK in the second cycle C2. At this time, the internal clock CLK1 is low and its inverted signal BCLK1 is high, turning off the clocked inverters 64 and 66.

When the internal clock CLK1 becomes high, the clocked inverters 64 and 66 turn on, allowing the data items in the read signal RD to be transferred from the node #5 to the node #7 and its inverted signal BRD to be transferred from the node #6 to the node #8. At this time, the output clock OUTCLK is low and its inverted signal BOUTCLK is high, turning off the clocked inverters 76 and 82. Thus, the second bit in the read data is read into the read signal RD and its inverted signal BRD.

When the external CLK in the third cycle C3 is received and the output clock OUTCLK becomes high, the clocked inverters 76 and 82 turn on, allowing the data items on the node #7 and node #8 to be transferred to the output terminal DQ.

After all the bits for the burst length are output, a pulse is generated in the equalize signal EQ in response to the external clock CLK in the next cycle C6.

In the meantime, when the equalize signal EQ becomes high, the transistors 132 and 134 turn on, bringing the node #5 and node #6 into the high level and the node #7 and node #8 into the low level.

When the output clock OUTCLK becomes high in response to the external clock CLK in the seventh cycle C7, the data items on the node #8 and node #7 are transferred to the subsequent stage, placing the node #10 and node #9 at the low level, which produces the high-impedance at the output terminal DQ.

As with the first embodiment, according to the third embodiment, in the data output circuit of the semiconductor integrated circuit device, any one of the low-level data item, high-level data item, and high-impedance-level data item is output in synchronization with the output clock. This makes it possible to equalize the data transfer path in outputting the high-impedance level. As a result, the data access time $t_{AC}$ and data hold time $t_{OH}$ are prevented from varying according to data item and/or cycle as shown in FIG. 15. This eliminates the dependence of the data access time and data hold time on data item and/or cycle and facilitates the timing control of the output control signal.

Fourth Embodiment

A fourth embodiment of the present invention will be explained by reference to FIGS. 16 to 18.

Figure 16:
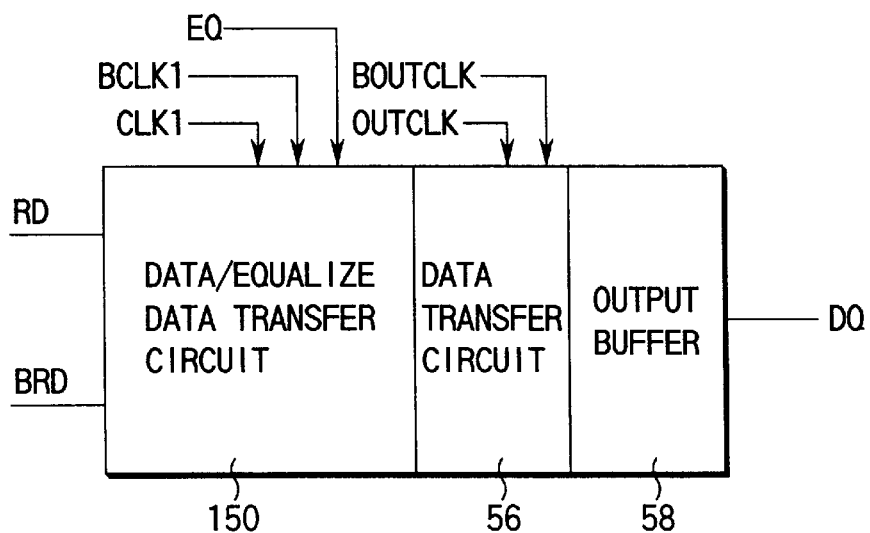
FIG. 16 is a functional block diagram of a data output circuit according to a fourth embodiment of a semiconductor integrated circuit device of the present invention.

FIG. 16 is a functional block diagram of a data output circuit according to a fourth embodiment of the present invention. FIG. 17 is a detailed circuit diagram of the data output circuit. FIG. 18 is a timing chart explaining the operation of the data output circuit.

As shown in FIG. 16, the data output circuit of the fourth embodiment differs from that of the first embodiment in that an equalizing circuit is included in the first data transfer circuit. Specifically, the data output circuit of the fourth embodiment comprises a data and equalize data transfer circuit 150 with the functions of the first data transfer circuit 52 and equalizing circuit 54 in the first embodiment, a data transfer circuit 56 serving as the second data transfer circuit of the first embodiment, and an output buffer 58. Each of the output buffer 58 and data transfer circuit 56 has the same configuration as that in the data output circuit of FIG. 8.

In synchronization with the internal signal CLK1, the data and equalize data transfer circuit 150 transfers either the data in the next cycle on a read line pair when the equalize signal EQ is low or the equalize data when the equalize signal EQ is high (in the next cycle after the final data item). In synchronization with the output clock OUTCLK, the data transfer circuit 56 transfers the data output in synchronization with the internal signal CLK1 from the equalize data transfer circuit 150. The output buffer 58 brings the output terminal DQ into one of the high level, low level, and high-impedance level according to the data transferred in synchronization with the output clock OUTCLK from the data transfer circuit 56.

Figure 17:
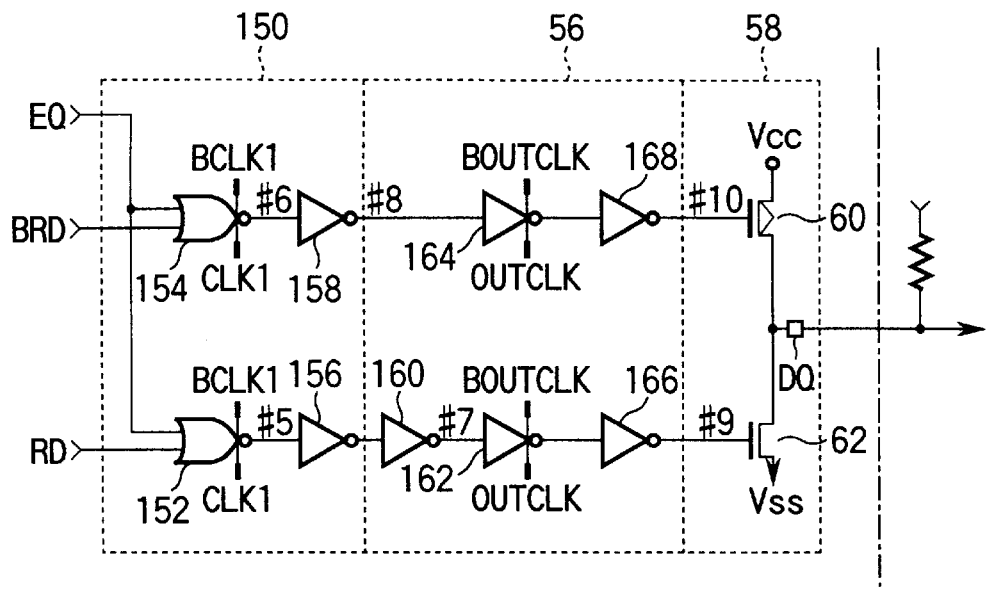
FIG. 17 is a detailed circuit diagram of the data output circuit of the fourth embodiment.
Figure 18:
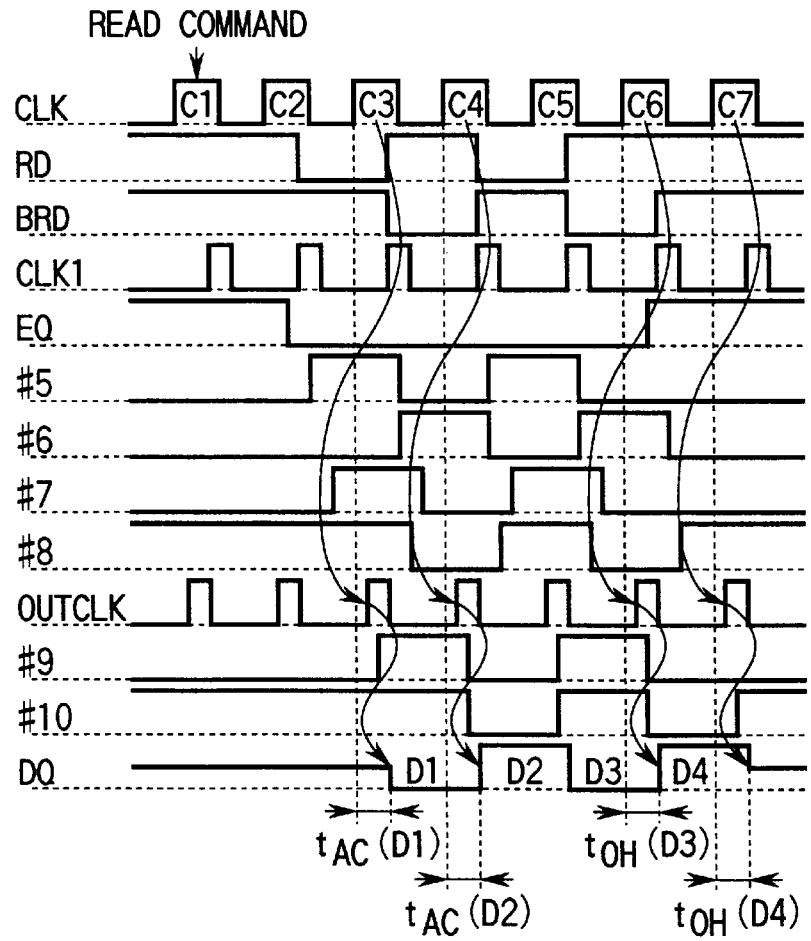
FIG. 18 is a waveform diagram explaining the operation of the data output circuit of the fourth embodiment.

As shown in FIG. 17, the data and equalize data transfer circuit 150 comprises clocked NOR gates 152 and 154 driven in synchronization with the internal clock CLK1. The read signal RD is input to the clocked NOR gate 152 and the inverted signal BRD of the read signal is connected to the clocked NOR gate 154. The equalize signal EQ is input to the clocked NOR gates 152 and 154. The outputs of the clocked NOR gates 152 and 154 are connected to inverters 156 and 158, respectively.

The equalize signal EQ is high during the time excluding the read operation. When the read command signal is received, the equalize signal EQ remains low during the time when the data is output according to the burst length.

The internal clock CLK1 is a signal for transferring the data items read from the memory into the read signal RD and its inverted signal BRD to the node #5 between the clocked NOR gate 152 and inverter 156 and to the node #6 between the clocked NOR gate 154 and inverter 158, respectively.

The output clock OUTCLK is a signal for outputting the data items on the node #7 between the inverter 160 and clocked inverter 162 and the node #8 between the inverter 158 and clocked inverter 164 to the output terminal DQ via inverters 166 and 168.

The operation of the data output circuit will be explained by reference to FIG. 18.

During the equalization excluding the read time, the equalize signal EQ is high, making the outputs of the clocked NOR gates 152 and 154 (the data items on the nodes #5 and #6) low, regardless of the levels of the read signal RD and its inverted signal BRD. When the read command signal is input in the first cycle C1 of the external clock CLK, the first bit in the data read from the memory is read into the read signal RD and its inverted signal BRD. Thereafter, the equalize signal EQ becomes low. At this time, the internal clock CLK1 is low and its inverted signal BCLK1 is high, turning off the clocked NOR gates 152 and 154. During the time when the equalize signal EQ is low, the clocked NOR gates 152 and 154 function in the same manner as the inverters to which the read signal RD and its inverted signal BRD are input.

Next, when the internal clock CLK1 becomes high, the clocked NOR gates 152 and 154 turn on, allowing the read signal RD to be transferred from the node #5 to the node #7 and the its inverted signal BRD to be transferred from the node #6 to the node #8. At that time, the output clock OUTCLK is low and its inverted signal BOUTCLK is high, turning off the clocked inverters 162 and 164.

Next, when the output clock OUTCLK becomes high in response to the external clock CLK in the third cycle C3, the clocked inverters 162 and 164 turn on, allowing the data items on the node #7 and node #8 to be transferred to the output terminal DQ.

After the bits for the burst length are output, the equalize signal EQ becomes high in response to the external clock CLK in the next cycle C6. When the internal CLK1 becomes high, the nodes #5, #6, and #7 become low and the node #8 becomes high.

When the output clock OUTCLK becomes high in response to the external clock CLK in the seventh cycle C7, the data items on the node #8 and node #7 are transferred, placing the node #9 at the low level and node #10 at the high level, which produces the high-impedance at the output terminal DQ.

As with the first embodiment, according to the fourth embodiment, in the data output circuit of the semiconductor integrated circuit device, any one of the low-level data item, high-level data item, and high-impedance-level data item is output in synchronization with the output clock. This makes it possible to equalize the data transfer path in outputting the high-impedance level. As a result, the data access time $t_{AC}$ and data hold time $t_{OH}$ are prevented from varying according to data item and/or cycle as shown in FIG. 18. This eliminates the dependence of the data access time and data hold time on data item and/or cycle and facilitates the timing control of the output control signal.

As described above, according to the present invention, because each of the low level, high level, and high-impedance level is output in synchronization with the output clock, neither the data access time $t_{AC}$ nor data hold time $t_{OH}$ depends on data item and/or cycle. The too fast switching of the equalize signal causes no problem, eliminating the need of subtlety adjusting the timing of the output control signal, which facilitates the timing control of the output control signal.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents. For example, while in the above embodiments, a clocked synchronous DRAM is used, an ordinary DRAM may be used.

What is claimed is:

1. A semiconductor integrated circuit device comprising:
a data output circuit configured to receive data read from a memory cell, transfer the data inside, and output the data outside; and
a control circuit configured to generate control signals to control the data transfer and the data output of said data output circuit,
wherein said data output circuit outputs all of data items in synchronization with an output clock, one of said control signals, and
wherein said data output circuit comprises
a first data transfer circuit to which the data read from the memory cell is input;
an equalizing circuit to which the output of said first data transfer circuit is input during a read operation of the data from the memory cell by a burst operation and which outputs high-impedance data after the read operation;
a second data transfer circuit to which an output of said equalizing circuit is supplied; and
an output buffer circuit to which the output of said second data transfer circuit is input.

2. A semiconductor integrated circuit device according to claim 1, wherein said data output circuit comprises:
a first data transfer circuit to which the data read from the memory cell is input and which includes an equalizing circuit;
a second data transfer circuit to which the output of said first data transfer circuit is input; and
an output buffer circuit to which the output of said second data transfer circuit is input.

3. A semiconductor integrated circuit device comprising:
a data output circuit configured to receive data read from a memory cell, configured to transfer the data inside, and output the data outside; and
a control circuit configured to control signals to control the data transfer and the data output of said data output circuit,
wherein said data output circuit outputs all of data items in synchronization with an output clock, one of said control signals, and
wherein said data output circuit comprises
a first data transfer circuit to which the data read from the memory cell is input and which includes an equalizing circuit through which the data transferred in the first data transfer circuit is output;
a second data transfer circuit to which the output of said equalizing circuit is input; and
an output buffer circuit to which the output of said second data transfer circuit is input.

4. A semiconductor integrated circuit device according to claim 3, wherein said data output circuit comprises:
a first data transfer circuit to which the data read from the memory cell is input;
an equalizing circuit to which the output of said first data transfer circuit is input during a read operation of the data from the memory cell by a burst operation and which outputs high-impedance data after the read operation;
a second data transfer circuit connected to said equalizing circuit; and
an output buffer circuit to which the output of said second data transfer circuit is input.

5. A semiconductor integrated circuit device comprising:
a memory cell array;
a first data transfer circuit to which data read from the memory cell is input and which transfers input data to an output side in synchronization with a first clock;
an equalizing circuit which is connected to an output of said first data transfer circuit, to which an output of said first data transfer circuit is input during a read operation of the data from said memory cell array, and which outputs high-impedance data after the read operation;
a second data transfer circuit to which an output of said equalizing circuit is input and which transfers and input data to an output side in synchronization with a second clock; and
an output buffer circuit to which an output of said second data transfer circuit is input,
wherein a data access time and a data hold time remain constant without depending on data item and/or cycle, and
wherein said first data transfer circuit includes a clocked inverter that operates on the basis of the first clock,
said equalizing circuit includes an inverter for transferring the output of said first data transfer circuit and a transistor for setting a transfer path to a specific potential on the basis of an equalize signal generated after the completion of the read operation,
said second data transfer circuit includes a clocked inverter that operates on the basis of the second clock, and
said output buffer circuit comprises an inverter.

6. A semiconductor integrated circuit device comprising:

a memory cell array;

a first data transfer circuit to which data read from the memory cell is input and which transfers input data to an output side in synchronization with a first clock;

an equalizing circuit which is connected to an output of said first data transfer circuit, to which an output of said first data transfer circuit is input during a read operation of the data from said memory cell array, and which outputs high-impedance data after the read operation;

a second data transfer circuit to which an output of said equalizing circuit is input and which transfers and input data to an output side in synchronization with a second clock; and an output buffer circuit to which an output of said second data transfer circuit is input, wherein a data access time and a data hold time remain constant without depending on data item and/or cycle, and wherein the output signal of said memory cell array and its inverted signal are transferred via said first data transfer circuit, equalizing circuit, second data transfer circuit, and output buffer circuit, the number of inverters in the transfer path for the output signal differing from that in the transfer path for the inverted signal by one, and said output buffer circuit combines the output signal and the inverted signal into a single output signal.

7. A semiconductor integrated circuit device comprising:

a memory cell array;

a first data transfer circuit to which data read from said memory cell array is input, which transfers an input data to an output side in synchronization with a first clock during a read operation of data from said memory cell array, and which outputs high-impedance data after the read operation;

a second data transfer circuit to which an output of said first data transfer circuit is input and which transfers an input data to an output side in synchronization with a second clock; and an output buffer circuit to which an output of said second data transfer circuit is input, wherein a data access time and a data hold time remain constant without depending on data item and/or cycle, and wherein said first data transfer circuit includes a clocked NAND gate which operates on the basis of the first clock and sets a transfer path to a specific potential on the basis of an equalize signal generated after the read operation, said second data transfer circuit includes a clocked inverter that operates on the basis of the second clock, and said output buffer circuit comprises an inverter.

8. A semiconductor integrated circuit device comprising:

a memory cell array, a first data transfer circuit to which data read from said memory cell array is input, which transfers an input data to an output side in synchronization with a first clock during a read operation of data from said memory cell array, and to which high-impedance data is input after the read operation;

a second data transfer circuit to which an output of said first data transfer circuit is input and which transfers an input data to an output side in synchronization with a second clock; and an output buffer circuit to which an output of said second data transfer circuit is input, wherein a data access time and a data hold time remain constant without depending on data item and/or cycle, and wherein the output signal of said memory cell array and its inverted signal are transferred via said first data transfer circuit, equalizing circuit, second data transfer circuit, and output buffer circuit, the number of inverters in the transfer path for the output signal differing from that in the transfer path for the inverted signal by one, and said output buffer circuit combines the output signal and the inverted signal into a single output signal.

* * * * *